United States Patent [19]

Nakayama et al.

[11] Patent Number: 5,189,504

[45] Date of Patent: Feb. 23, 1993

[54] SEMICONDUCTOR DEVICE OF MOS STRUCTURE HAVING P-TYPE GATE ELECTRODE

[75] Inventors: Satoshi Nakayama; Tetsushi Sakai, both of Kanagawa, Japan

[73] Assignee: Nippon Telegraph and Telephone Corporation, Japan

[21] Appl. No.: 827,904

[22] Filed: Jan. 30, 1992

Related U.S. Application Data

[63] Continuation of Ser. No. 624,402, Dec. 7, 1990, abandoned.

[30] Foreign Application Priority Data

Dec. 11, 1989 [JP] Japan .................................. 1-318791
Oct. 2, 1990 [JP] Japan .................................. 2-263089

[51] Int. Cl.$^5$ .................. H01L 29/04; H01L 29/167; H01L 29/207; H01L 29/227
[52] U.S. Cl. .................. 257/422; 257/756; 257/914
[58] Field of Search .............. 357/59, 63, 91, 23.1, 357/23.15

[56] References Cited

U.S. PATENT DOCUMENTS

| | | | |
|---|---|---|---|
| 4,074,300 | 2/1978 | Sakai et al. ............................. | 357/59 |
| 4,180,826 | 12/1979 | Shappir .................................. | 357/59 |
| 4,267,011 | 5/1981 | Shibata et al. ........................ | 357/91 |
| 4,309,224 | 1/1982 | Shibata .................................. | 357/59 |
| 4,558,338 | 12/1985 | Sakata .................................... | 357/59 |
| 4,601,778 | 7/1986 | Robb ..................................... | 156/657 |
| 4,755,865 | 7/1988 | Wilson et al. ......................... | 357/63 |
| 4,772,927 | 9/1988 | Saito et al. ............................. | 357/63 |

OTHER PUBLICATIONS

T. Hori, "Demands for Submicron MOSFET's and Nitrided Oxide Gate-Dielectrics", Extended Abstracts of the 21st Conference on Solid State Devices and Materials, Tokyo, 1989, pp. 197–200.
J. M. Sung et al., "Fluorine Effect on Boron Diffusion of P+ Gate Devices", 1989 IEDM89, pp. 447–450.
I. Kato et al., "Ammonia-Annealed SiO$_2$ Films for Thin-Gate Insulator", *Japanese Journal of Applied Physics*, vol. 21 (1982) Supplement 21-1, pp. 153–158.
F. K. Baker et al., "The Influence of Fluorine on Threshold Voltage Instabilities in P+ Polysilicon Gated P-Channel MOSFETs", 1989 DEDM89, pp. 443–446.
J. Y. C. Sun et al., "Study of Boron Penetration Through Thin Oxide with P+-Polysilicon Gate", *Digest of the International Symposium on VLSI Technology* (1989), pp. 17–18.
M. Miyake et al., "Subquarter-Micrometer Gate—Length p-Channel and n-Channel MOSFET's with Extremely Shallow Source-Drain Junctions", *IEEE Transactions on Electron Devices*, vol. 36, No. 2, Feb. 1989, pp. 392–397.
N. Kasai et al., "0.25 μm CMOS Technology Using P+ Polysilicon Gate PMOSFET", 1987, IEDM87, pp. 367–370.
E. N. Mokhov et al., "Constant-Concentration Diffusion of Boron in Silicon Carbide", *Sov. Phys. Solid State* 30(1), Jan. 1988, pp. 140–141.

*Primary Examiner*—J. Carroll
*Attorney, Agent, or Firm*—Blakely, Sokoloff, Taylor & Zafman

[57] ABSTRACT

A semiconductor device of a MOS structure having a p-type gate electrode has a gate electrode including at least two layers consisting of a boron-doped polysilicon layer and a polysilicon layer doped with boron and an inert material. This inert material is nitrogen or carbon.

4 Claims, 9 Drawing Sheets

SEMICONDUCTOR DEVICE OF MOS STRUCTURE HAVING P-TYPE GATE ELECTRODE

This is a continuation of application Ser. No. 624,402 filed Dec. 7, 1990, abandoned.

BACKGROUND OF THE INVENTION

The present invention relates to a semiconductor device of a MOS structure having a p-type gate electrode and a method of manufacturing the same.

The most popular structure of the existing LSIs is a CMOS structure in which a p-channel MOS field effect transistor (FET) and an n-channel MOSFET are formed on a single substrate. The gate electrodes of these transistors used in this LSI consist of n-type polysilicon. A difference in work function between such a gate electrode and the substrate is about 1 eV for the n-channel MOSFET and is about 0 eV for the p-channel MOSFET. For this reason, a difference of 1 V or more is formed between the threshold voltages of these MOSFETs. As a result, the power source margin at the time of design is undesirably reduced.

In order to reduce the above threshold voltage difference, the p-channel MOSFET has a buried channel structure wherein its channel region is formed slightly inside the surface of the substrate. Even if the buried channel structure is used, however, the threshold voltage of the p-channel MOSFET cannot be perfectly set to be equal to that of the n-channel MOSFET. In addition, the buried channel has a disadvantage in formation of a short channel.

In order to solve these problems and cope with a future high-density, low-voltage LSI, minimum requirements required for a gate electrode of a p-channel MOSFET are three indispensable conditions as follows: (1) the work function of a portion contacting a gate insulator is about 5 eV; (2) the entire gate electrode has a low resistance; and (3) The gate structure must be compatible with the state-of-the-art fabrication process. When these points are taken into consideration, a gate electrode comprising boron-doped polysilicon and a low-resistance metal silicide film formed on this polysilicon is most promising.

When a gate electrode consists of boron-doped polysilicon, boron atoms are diffused fast in a silicon oxide film used as a gate insulator. The boron atoms are diffused from the gate electrode to the substrate in annealing performed upon formation of the gate electrode, and the threshold voltage of the resultant transistor undesirably varies. In particular, diffusion of the boron atoms is accelerated in an atmosphere containing hydrogen or steam, and the threshold voltage of the transistor varies even in relative low-temperature annealing. This mechanism will be described with reference to the drawings.

FIG. 14 shows the diode capacitance vs. gate voltage characteristics of a MOS diode having a gate electrode consisting of polysilicon doped with only boron. The capacitance is plotted along the ordinate, and the gate voltage is plotted along the abscissa in FIG. 14. The atmosphere during annealing is an oxygen atmosphere containing steam, and annealing time is 30 minutes. Other conditions are given such that the thickness of a gate oxide film is 3.5 nm, a layer doped with an n-type impurity is not present, a diode area is $10^{-4}$ cm$^2$, a substrate impurity concentration is $3 \times 10^{15}$ cm$^{-3}$, a characteristic curve c obtained by only activation annealing (700° C.; 30 minutes; dry nitrogen atmosphere) as a reference in addition to characteristic curves a and b obtained by annealing at temperatures of 850° C. and 800° C.

Referring to FIG. 14, in the characteristic curve c obtained by only activation annealing, characteristics on the positive inversion side of the gate voltage coincide with theoretical values. However, when annealing is performed at temperatures of 800° C. or more, as indicated by the characteristic curves a and b, the threshold voltage is shifted to a higher voltage, thus indicating that boron is diffused in the substrate. This diffusion influence of boron is increased when the thickness of the gate oxide film is reduced.

In order to solve the above problem, (a) the annealing process is limited; (b) a gate insulator which suppresses boron diffusion is used; and (c) boron diffusion in the gate electrode is suppressed. The countermeasure (a) imposes large limitations on the fabrication process. In the countermeasure (b), use of silicon nitride as all or part of the gate insulator has been taken into consideration. However, at present, any material which can cope with a silicon oxide film is not practically proposed as far as MOS characteristics such as interface state, charge trap, and leakage current are concerned. According to the present invention, therefore, a means for suppressing boron diffusion in the gate electrode in the countermeasure (c) is employed.

SUMMARY OF THE INVENTION

It is, therefore, a principal object of the present invention to provide a semiconductor device having a p-type gate electrode which can suppress boron diffusion from the gate electrode to a substrate and exhibits stable characteristics, and a method of manufacturing the same.

It is another object of the present invention to provide a semiconductor device having a p-type gate electrode capable of increasing a power source margin at the time of design and a method of manufacturing the same.

It is still another object of the present invention to provide a semiconductor device having a p-type gate electrode capable of being applied to a low-voltage, high-performance LSI, and a method of manufacturing the same.

In order to achieve the above objects of the present invention, the present invention employs a means for doping an inert impurity such as nitrogen or carbon in polysilicon in addition to boron to suppress boron diffusion while the work function of polysilicon is kept high.

According to an aspect of the present invention, there is provided a semiconductor device of a MOS structure having a p-type gate electrode, wherein the gate electrode comprises a gate electrode including at least two layers consisting of a boron-doped polysilicon layer and a polysilicon layer doped with boron and an inert material.

According to another aspect of the present invention, there is provided a method of manufacturing a semiconductor device of a MOS structure having a p-type gate electrode, including the steps of depositing a polysilicon layer doped with at least an inert material by using a source gas consisting of a gas mixture of at least a silicon hydride ($Si_nH_{2n+2}$, $n \geq n$) and ammonia gas ($NH_3$) within a deposition temperature range of 400° to 650°

C., and forming a boron-doped polysilicon layer on the polysilicon layer doped with at least the inert material.

According to still another aspect of the present invention, there is provided a method of manufacturing a semiconductor device of a MOS structure having a p-type gate electrode, including the steps of depositing a polysilicon layer doped with at least an inert material by using a source gas consisting of a gas mixture of at least a silicon hydride ($Si_nH_{2n+2}$, $n \geq n$) and acetylene gas within a deposition temperature range of 400° to 650° C., and forming a boron-doped polysilicon layer on the polysilicon layer doped with at least the inert material.

DESCRIPTION OF THE PREFERRED EMBODIMENTS

A gate electrode using a nitrogen-, boron-doped polysilicon layer will be described below according to an embodiment of the present invention.

Figure 1:
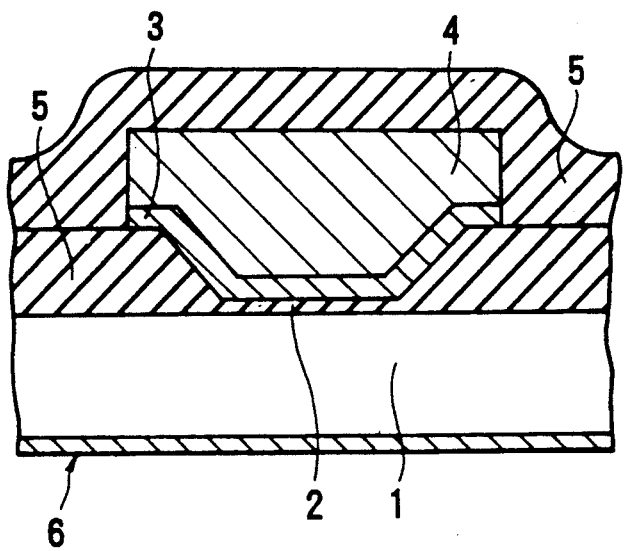
FIG. 1 is a sectional view of a gate electrode of a MOS diode as a semiconductor device having a p-type gate electrode according to an embodiment of the present invention.

FIG. 1 shows a schematic structure of a MOS diode as a semiconductor device having a p-type gate electrode. Reference numeral 1 denotes a silicon substrate; 2, a gate oxide film; 3, a nitrogen-, boron-doped polysilicon layer; 4, a boron-doped polysilicon layer; 5, an insulating film; and 6, an aluminum back electrode. The silicon substrate comprises a p-type substrate whose boron concentration is $3 \times 10^{15}$ cm$^3$. The thickness of the gate oxide film is 3.5 nm, the thickness of the nitrogen-, boron-doped polysilicon layer 3 is 5 nm, the thickness of the boron-doped polysilicon layer 4 is 300 nm, and the boron concentration of the boron-doped polysilicon layer 4 is $2 \times 10^{20}$ cm$^{-3}$.

Figure 2:
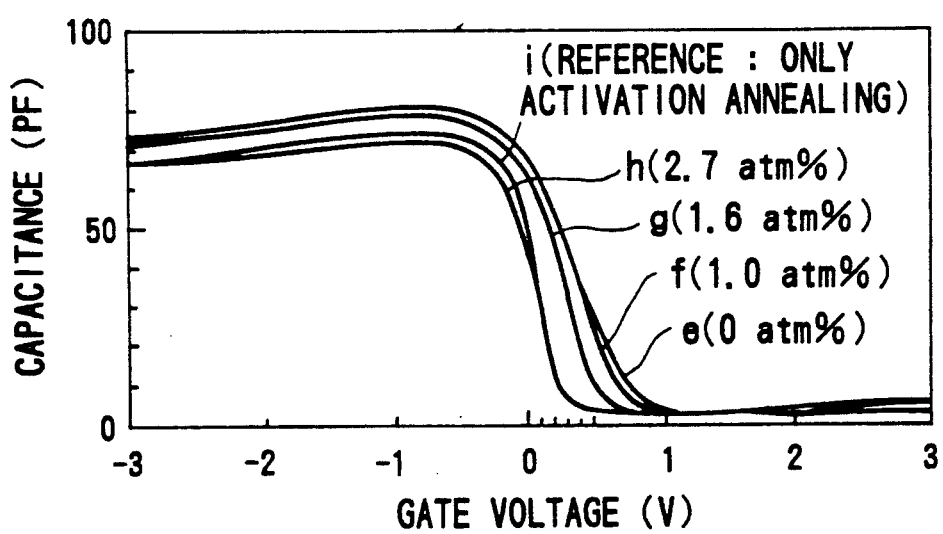
FIG. 2 is a graph showing the gate electrode capacitance vs. gate voltage characteristics of the MOS diode shown in FIG. 1.

FIG. 2 shows capacitance vs. gate electrode characteristics of the MOS diode of this embodiment. The capacitance is plotted along the ordinate of FIG. 2, and the gate voltage is plotted along the abscissa. In this embodiment, the diode area is $10^{-4}$ cm$^2$, the thickness of the gate oxide film is 3.5 nm, and a nitrogen-doped layer has a thickness of 5 nm. Annealing upon formation of the gate electrode is performed in an oxygen atmosphere containing steam at 850° C. for 30 minutes. A characteristic curve e is obtained in a nitrogen concentration of 0 atm%, and characteristic curves f, g, and h are obtained in nitrogen concentrations of 1.0, 1.6, and 2.7 atm%, respectively. A reference characteristic curve i is obtained by activation annealing in a dry nitrogen atmosphere at 700° C. for 30 minutes. The gate voltage characteristic on the positive inversion side almost coincides with a theoretical value. When the nitrogen concentration of the nitrogen-doped polysilicon layer is 0%, i.e., the nitrogen concentration is equal to that in the conventional arrangement (characteristic curve e), the threshold voltage is shifted to a higher voltage. However, as indicated by the characteristic curves f, g, and h, the threshold voltage shift becomes smaller when the nitrogen concentration of the nitrogen-doped polysilicon layer is increased. When the nitrogen concentration is 2.7% as indicated by the characteristic curve h, the threshold characteristic is almost equal to that indicated by the reference characteristic curve i.

Figure 3:
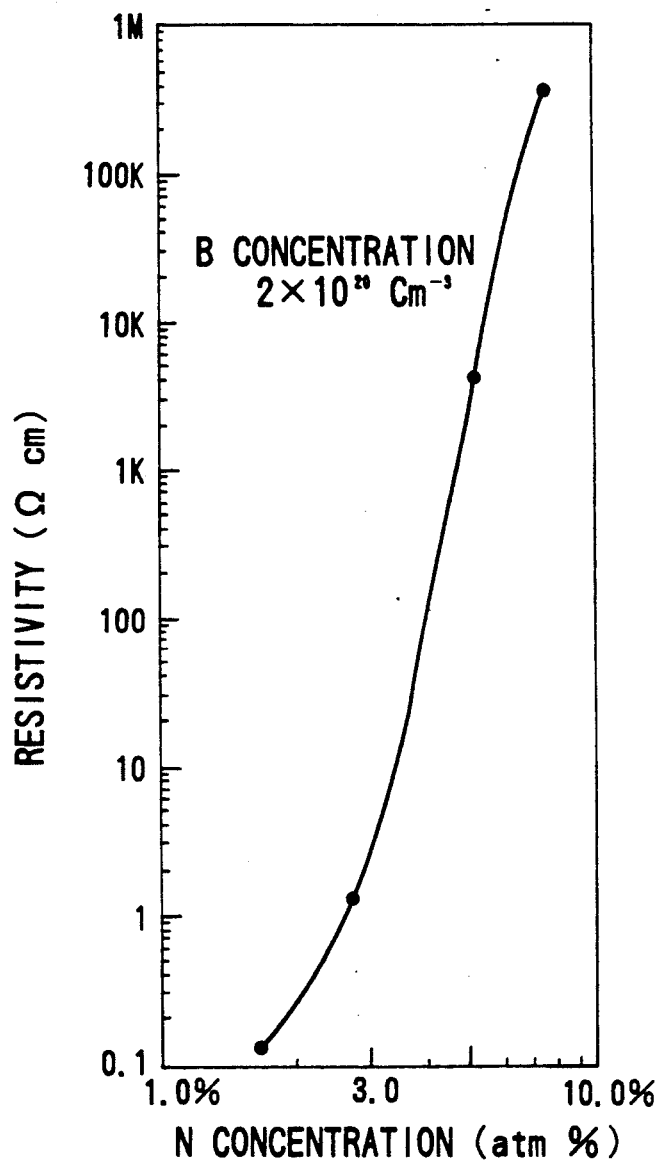
FIG. 3 is a graph showing resistivity vs. nitrogen concentration of a nitrogen-, boron-doped polysilicon layer used as the gate electrode of the MOS diode shown in FIG. 1.

FIG. 3 shows nitrogen concentration dependency of the resistivity of the nitrogen-, boron-doped polysilicon film. The resistivity is plotted along the ordinate in FIG. 3, and the nitrogen concentration is plotted along the abscissa. In this case, the boron concentration is $2 \times 10^{20}$ cm$^{-3}$. When the nitrogen concentration is increased, the resistivity is abruptly increased. For example, however, when the nitrogen concentration is about 3 atm%, the resistivity is several Ω-cm, so that this polysilicon layer can be used as a gate electrode.

Figure 7:
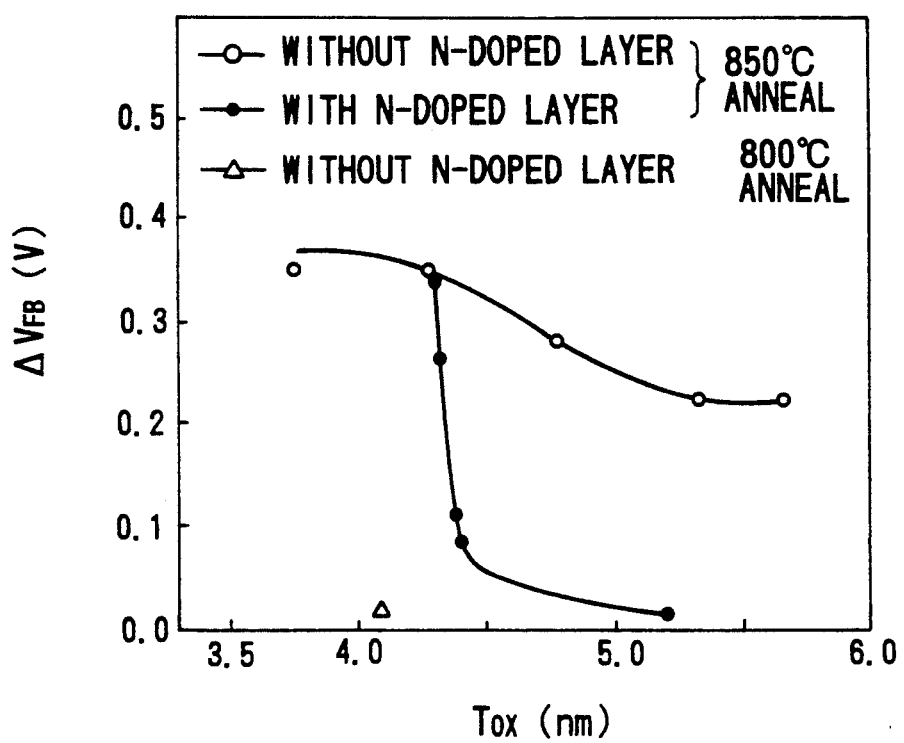
FIG. 7 is a graph showing flat band voltage difference vs. apparent oxide film thickness characteristics obtained when an effect of a nitrogen-doped polysilicon layer is compared with an increase in thickness of the gate oxide film.

The flat band voltage difference $\Delta V_{FB}$ between a flat band voltage of a sample having an oxide film through which boron penetrates and a flat band voltage of a sample in which boron diffusion is negligible is plotted along the ordinate of FIG. 7, and the apparent thickness $T_{OX}$ of the oxide film obtained by high-frequency characteristics of the MOS capacitor is plotted along the abscissa. A hollow circle indicates a case wherein no nitrogen-doped silicon layer is present and the thickness of the oxide film is changed. A black dot indicates a case wherein the thickness of the oxide film is kept unchanged and the nitrogen concentration of the nitrogen-doped silicon layer is constantly changed. The flat band voltage difference $\Delta V_{FB}$ is about 0.2 V or more even at 5.6 nm of the apparent oxide thickness in the case of changing the oxide film thickness. It is apparent that boron penetrates through the oxide film. To the contrary, when the nitrogen-doped silicon layer is present, and the apparent thickness of the oxide film is 4.3 nm, the flat band voltage difference $\Delta V_{FB}$ is reduced to 0.1 V. These results show that the nitrogen-doped silicon layer is more effective than increasing the gate oxide thickness at suppressing the penetration of boron. A hollow triangle shows a case wherein a nitrogen-doped silicon layer is not present, and the annealing temperature is 800° C. As compared with this annealing temperature of 800° C, the nitrogen-doped silicon layer apparently provides a process margin of 50° C. for the annealing temperature.

As is apparent from the above description, according to the present invention, a two-layered gate electrode including at least the boron-doped polysilicon layer and the nitrogen-, boron-doped polysilicon layer is arranged to suppress diffusion of boron from the gate electrode to the silicon substrate. Even if annealing is performed upon formation of the gate electrode, no variations in characteristics of the semiconductor device do not occur. In addition, since a silicon oxide film is used as a gate oxide film as in a conventional structure, the interface characteristics between the silicon oxide film and the silicon substrate are not degraded.

In this embodiment, the semiconductor device is exemplified as a MOS diode. However, variations in characteristics can be prevented by employing the gate electrode having the above-mentioned structure in a MOS transistor, or its IC. In the above embodiment, the two-layered gate electrode comprising the nitrogen-, boron-doped silicon layer and the boron-doped silicon layer is used. However, the gate electrode may comprise (a) a three-layered structure consisting of a thin boron-doped layer, a nitrogen-, boron-doped silicon silicon layer, and a thick boron-doped silicon layer, (b) a three-layered structure consisting of a nitrogen-, boron-doped silicon layer, a boron-doped silicon layer, and a metal silicide film, or (c) a two-layered structure consisting of a nitrogen-, boron-doped silicon layer and a metal silicide layer.

Figure 4:
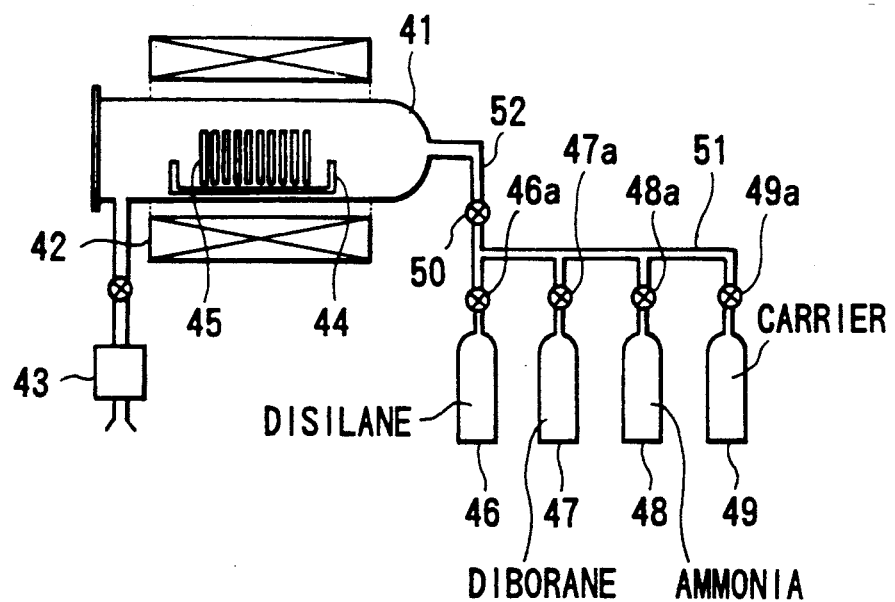
FIG. 4 is a schematic view of an apparatus for depositing a nitrogen-, boron-doped polysilicon layer used in a method of manufacturing a semiconductor device having a p-type gate electrode according to the present invention.

A method of manufacturing a semiconductor device having a p-type gate electrode according to the present invention will be described below. FIG. 4 shows an apparatus for depositing a nitrogen-, boron-doped polysilicon layer.

A reactor apparatus of this embodiment is a most popular low-pressure CVD apparatus of a diffusion furnace type. Reference numeral 41 denotes a reaction tube; 42, an electric furnace including a heater; 43, an evacuation system; 44, a quartz boat; 45, silicon substrates placed on the quartz boat 44. Reference numerals 46 to 49 denote a plurality of gas cylinders connected to the reaction tube 41 through valves 46a to 49a and 50 and conduits 51 and 52. The gas cylinder 46 serves as a disilane ($Si_2H_6$) gas cylinder, the gas cylinder 47 serves as a diborane ($B_2H_6$) gas cylinder, the gas cylinder 48 serves as an ammonia ($NH_3$) gas cylinder, and the gas cylinder 49 serves as a carrier gas cylinder.

A semiconductor device is manufactured by the conventional known method up to formation of a gate oxide film. The silicon substrates during the manufacture are placed on the quartz boat 44 and are inserted into the reaction tube 41 heated at 400° to 650° C. The reaction tube 41 is then evacuated. When reaction tube temperature is stabilized, disilane gas, ammonia gas, and diborane gas (diluted with He to 100 ppm) are supplied to the reaction tube 41 at flow rates of 100 SCCM, 100 SCCM, and 300 SCCM, respectively, for a desired period of time, i.e., 40 seconds to deposit nitrogen-, boron-doped silicon films on the respective silicon substrates.

When 40 seconds have elapsed, supply of the ammonia gas to the reaction tube 41 is stopped. The disilane, diborane, and carrier gases are kept supplied to the reaction tube 41 for 25 minutes to deposit boron-doped silicon layers on the nitrogen-, boron-doped silicon layers of the respective silicon substrates. The silicon substrates are then removed from the reaction tube 41, and gate electrodes are formed on the respective silicon substrates by the conventional method.

Figure 5:
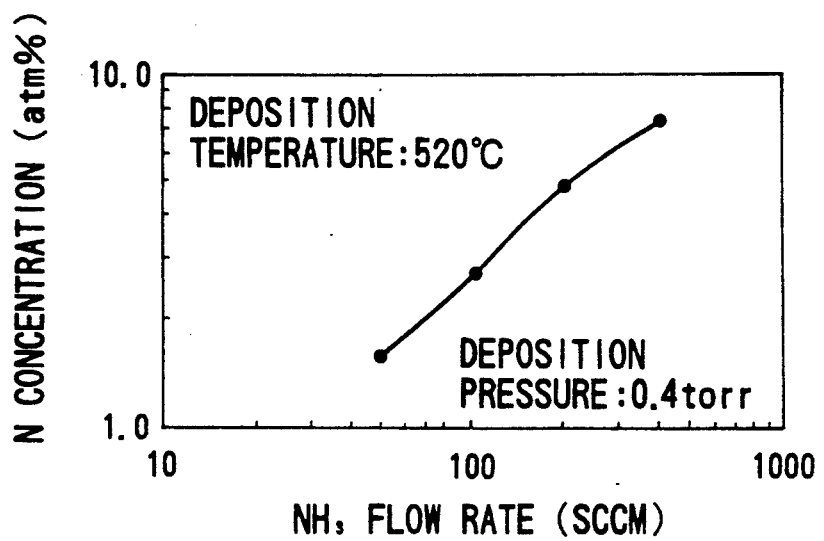
FIG. 5 is a graph showing a relationship between the nitrogen concentration in a nitrogen-doped polysilicon film and the ammonia flow rate.

The silicon substrates are then annealed in appropriate conditions, and the upper and lower electrodes are formed on each silicon substrate by the conventional method. FIG. 5 shows a relationship between the nitrogen (N) concentration in the nitrogen-doped polysilicon film and the ammonia ($NH_3$) flow rate. When the ammonia flow rate is increased, the nitrogen concentration is increased. When the ammonia flow rate is 100 SCCM, the nitrogen concentration is about 3 atm%. In this case, the deposition temperature is 520° C., the disilane gas flow rate is 100 SCCM, and the deposition pressure is 0.4 Torr.

Figure 6:
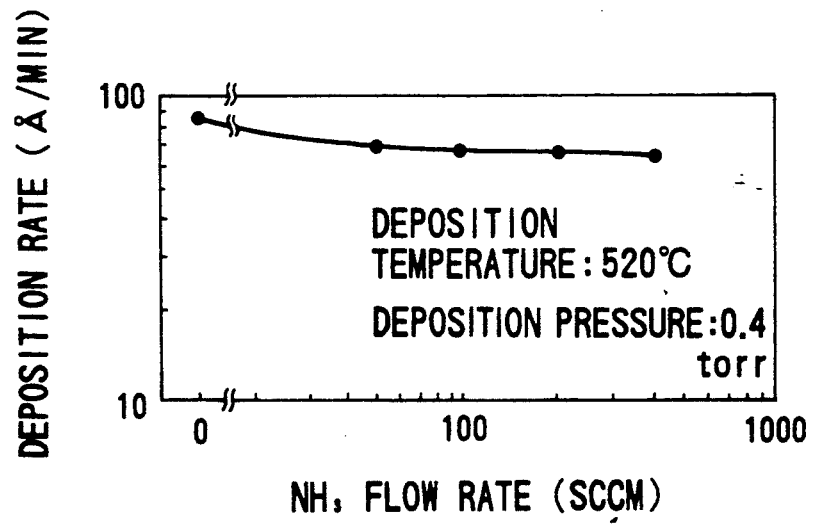
FIG. 6 is a graph showing a relationship between the deposition rate of the nitrogen-doped polysilicon film and the ammonia flow rate.

FIG. 6 shows a relationship between the deposition rate of the nitrogen-doped polysilicon film and the ammonia flow rate. When the ammonia flow rate is increased, the deposition rate is slightly decreased. However, even when the deposition temperature is 520° C. and the ammonia flow rate is 400 SCCM, a practical deposition rate of 62 Å/minute can be obtained.

FIG. 7 shows an effect of the nitrogen-doped polysilicon layer as compared with an increase in thickness of the gate oxide film.

In this embodiment, disilane ($Si_2H_6$) is used as a silicon hydride. However, silane ($SiH_4$) as a more practical material or trisilane ($Si_3H_8$) which allows deposition at a lower temperature may be used. In this embodiment, the nitrogen-, boron-doped polysilicon layer is formed using disilane, ammonia, and diborane gases. However, after a nitrogen-doped silicon layer is formed by a gas mixture of a silicon hydride and ammonia, a nitrogen-, boron-doped polysilicon layer may be formed by ion implantation or diffusion of boron from another material.

According to the apparatus of this embodiment, as described above, diffusion of boron from the gate electrode to the silicon substrate can be suppressed. Variations in characteristics of the semiconductor device can be prevented even if annealing is performed upon formation of the gate electrode. According to the method of the embodiment described above, a nitrogen-doped silicon film capable of suppressing diffusion of boron from the gate electrode to the substrate can be deposited at a practical rate, thereby providing a semiconductor device having a p-type gate electrode stable against annealing.

According to another embodiment of the present invention, a gate electrode using a carbon-, boron-doped polysilicon layer will be described below.

Figure 8:
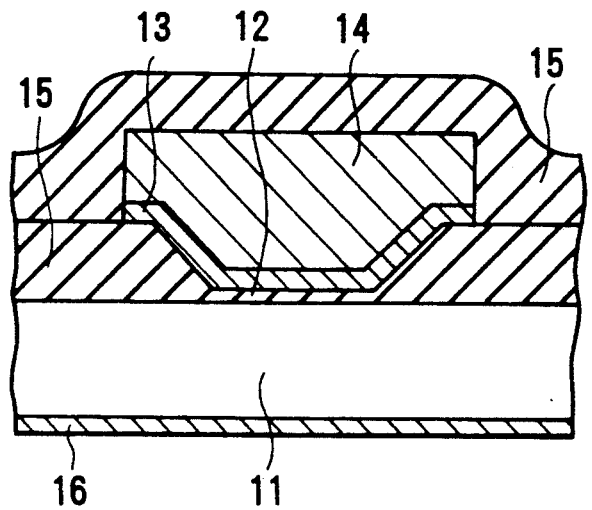
FIG. 8 is a sectional view of a gate electrode of a MOS diode as a semiconductor device according to another embodiment of the present invention.

FIG. 8 shows an arrangement obtained by applying a semiconductor device of the present invention to a MOS diode. Referring to FIG. 8, reference numeral 11 denotes a silicon substrate; 12, a gate oxide film; 13, a carbon-, boron-doped polysilicon layer; 14, a boron-doped polysilicon layer; 15, an insulating film; and 16, an aluminum back electrode. The silicon substrate 11 is a p-type substrate having a boron concentration of $3 \times 10^{15}$ cm$^{-3}$. The thickness of the gate oxide film 12 is 3.5 nm, the thickness of the carbon-, boron-doped polysilicon layer 13 is 5 nm, the thickness of the boron-doped polysilicon layer 14 is 300 nm, and the boron concentration of the boron-doped polysilicon layer is $2 \times 10^{20}$ cm$^{-3}$.

Figure 9:
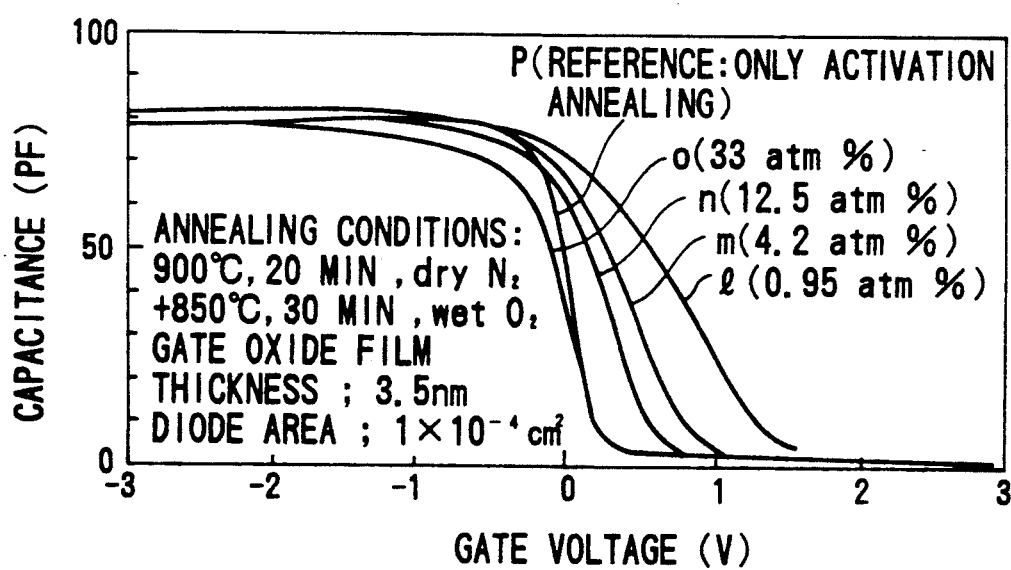
FIG. 9 is a graph showing gate electrode capacitance vs. gate voltage characteristics of the MOS diode shown in FIG. 8.

FIG. 9 shows capacitance vs. gate voltage characteristics of the MOS diode shown in FIG. 8. The capacitance is plotted along the ordinate of FIG. 9, and the gate voltage is plotted along the abscissa. In this embodiment, the diode area is $10^{-4}$ cm$^2$. Annealing upon formation of a gate electrode is performed in a nitrogen atmosphere (dry N$_2$) at 900° C. for 20 minutes and then in an oxygen atmosphere (wet O$_2$) containing steam at 850° C. for 30 minutes. A characteristic curve l shows a case in a carbon concentration of 0.95 atm%, and characteristic curves m, n, and o show cases in the carbon concentrations of 4.2, 12.5, and 33 atm%, respectively. A reference characteristic curve p is obtained by only activation annealing, which almost coincides with the positive inversion side of the gate electrode. When the carbon concentration of the carbon-doped polysilicon layer is 0.95 atm%, as indicated by the characteristic curve l, the threshold voltage is largely shifted to a high voltage. However, when the carbon concentration of the carbon-doped polysilicon layer is gradually increased, as indicated by the characteristic curves m, n, and o, variations in threshold voltage are reduced. When the carbon concentration is 33 atm%, as indicated by the characteristic curve o, the characteristics are almost equal to those indicated by the reference characteristic curve p.

Figure 10:
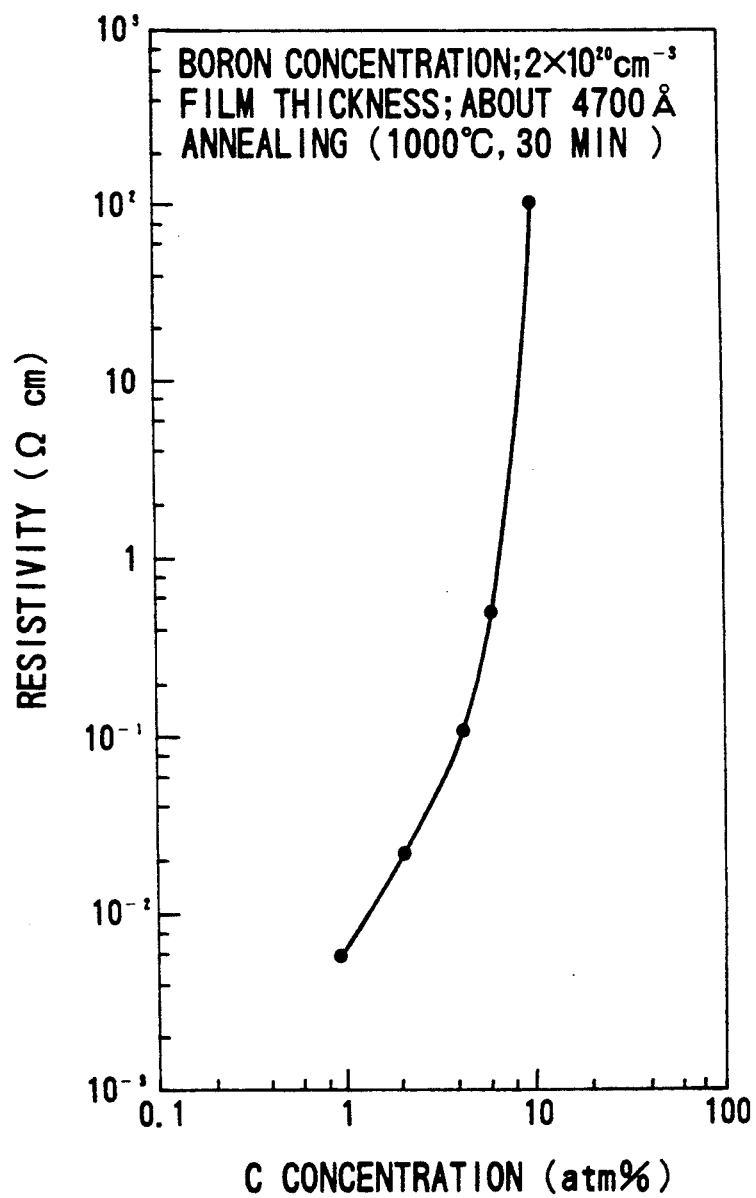
FIG. 10 is a graph showing resistivity vs. carbon concentration characteristics of a carbon-, boron-doped polysilicon layer used as the gate electrode of the MOS diode shown in FIG. 8.

FIG. 10 shows carbon concentration dependency of the resistivity of the carbon-, boron-doped polysilicon layer 13. In this case, the boron concentration is $2 \times 10^{20}$ cm$^{-3}$, and annealing is performed at 1,000° C. for 30 minutes. When the carbon concentration is increased, the resistivity is abruptly increased.

According to the second embodiment, as described above, a two-layered gate electrode including at least the boron-doped polysilicon layer and the carbon-, boron-doped polysilicon layer is formed to suppress diffusion of boron from the gate electrode to the silicon substrate. Variations in characteristics of the semiconductor device can be prevented even if annealing is performed upon formation of the gate electrode.

In this embodiment, the semiconductor device is exemplified as a MOS diode. However, variations in characteristics can be prevented by employing the gate electrode having the above-mentioned structure in a MOS transistor, or its IC. In the above embodiment, the two-layered gate electrode comprising the carbon-, boron-doped silicon layer and the boron-doped silicon layer is used. However, the gate electrode may comprise (a) a three-layered structure consisting of a thin boron-doped silicon layer, a carbon-, boron-doped silicon layer, and a thick boron-doped silicon layer, (b) a three-layered structure consisting of a carbon-, boron-doped silicon layer, a boron-doped silicon layer, and a metal silicide film, or (c) a two-layered structure consisting of a carbon-, boron-doped silicon layer and a metal silicide layer.

A method of manufacturing a semiconductor device having a p-type gate electrode according to the second embodiment will be described below.

Figure 11:
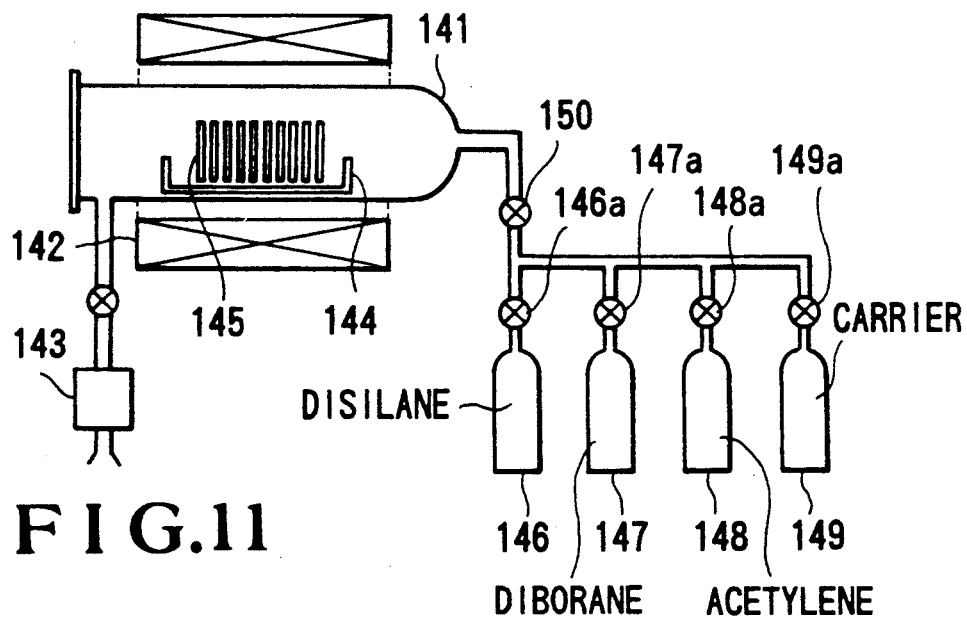
FIG. 11 is a schematic view of an apparatus for depositing the carbon-, boron-doped polysilicon layer according to another method of manufacturing a semiconductor device according to the present invention.

FIG. 11 shows an apparatus for depositing a carbon-, boron-doped polysilicon layer. A reactor apparatus of this embodiment is a most popular low-pressure CVD apparatus of a diffusion furnace type. Reference numeral 141 denotes a reaction tube; 142, an electric furnace; 143, an evacuation system; 144, a quartz boat; 145, silicon substrates placed on the quartz boat 144. Reference numerals 146 to 149 denote a plurality of gas cylinders connected to the reaction tube 141 through valves and conduits. The gas cylinder 146 serves as a disilane (Si$_2$H$_6$) gas cylinder, the gas cylinder 147 serves as a diborane (B$_2$H$_6$) gas cylinder, the gas cylinder 148 serves as an acetylene (C$_2$H$_2$) gas cylinder, and the gas cylinder 149 serves as a carrier gas cylinder.

A semiconductor device is manufactured by the conventional known method up to formation of a gate oxide film. The silicon substrates 145 during the manufacture are placed on the quartz boat 144 and are inserted into the reaction tube 141 heated at 400° to 650° C. The reaction tube 141 is then evacuated. When reaction tube temperature is stabilized, disilane gas, acetylene gas, and diborane gas (diluted with He to 100 ppm) are supplied to the reaction tube 141 at flow rates of 100 SCCM, 100 SCCM, and 300 SCCM, respectively, for a desired period of time, i.e., 25 seconds to deposit carbon-, boron-doped silicon films on the respective silicon substrates. When 25 seconds have elapsed, supply of the acetylene gas to the reaction tube 141 is stopped. The disilane, diborane, and carrier gases are kept supplied to the reaction tube 141 for 25 minutes to deposit boron-doped silicon layers on the carbon-, boron-doped silicon layers of the respective silicon substrates. The silicon substrates are then removed from the reaction tube 141, and gate electrodes are formed on the respective silicon substrates by the conventional method. The silicon substrates are then annealed in appropriate conditions, and the upper and lower electrodes are formed on each silicon substrate by the conventional method.

Figure 12:
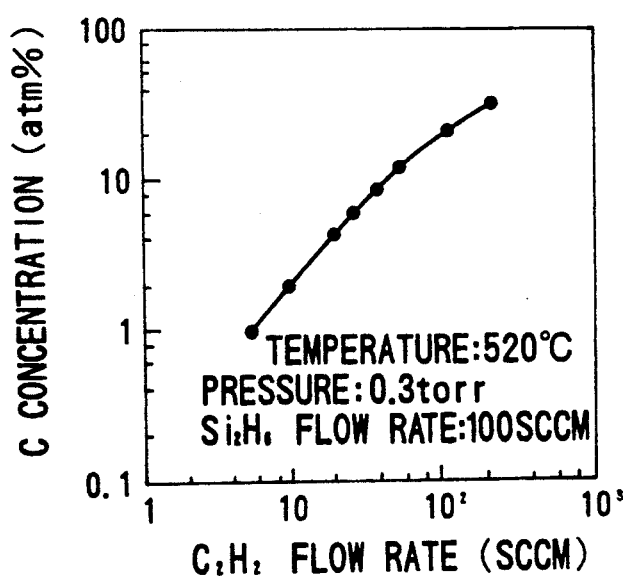
FIG. 12 is a graph showing a relationship between the carbon concentration in a carbon-doped polysilicon layer and the acetylene gas flow rate.

FIG. 12 shows a relationship between the carbon (C) concentration and the acetylene (C$_2$H$_6$) flow rate of the carbon-doped polysilicon film. When the acetylene flow rate is increased, the carbon concentration is increased. When the acetylene flow rate is 100 SCCM, the carbon concentration is about 13 atm%. In this case, the deposition temperature is 520° C., the deposition pressure is 0.3 Torr, and the Si$_2$H$_6$ flow rate is 100 SCCM.

Figure 13:
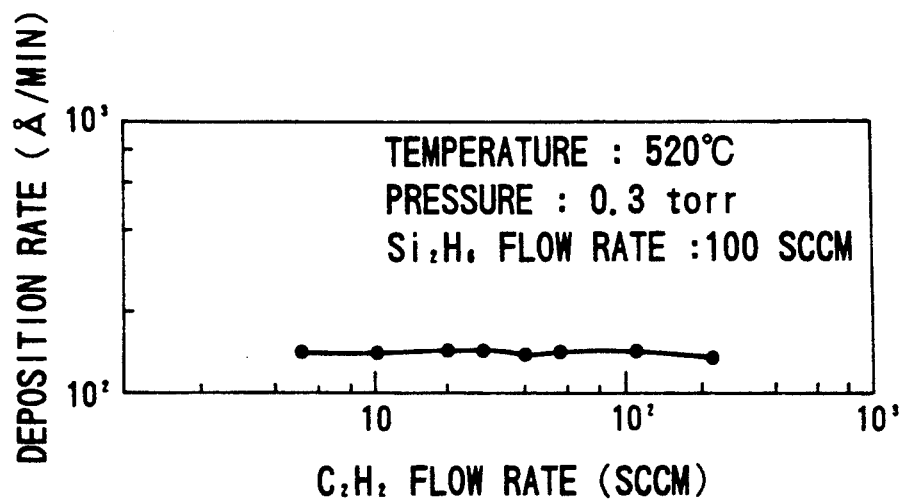
FIG. 13 is a graph showing a relationship between the deposition rate of the carbon-doped polysilicon layer and the acetylene gas flow rate.
Figure 14:
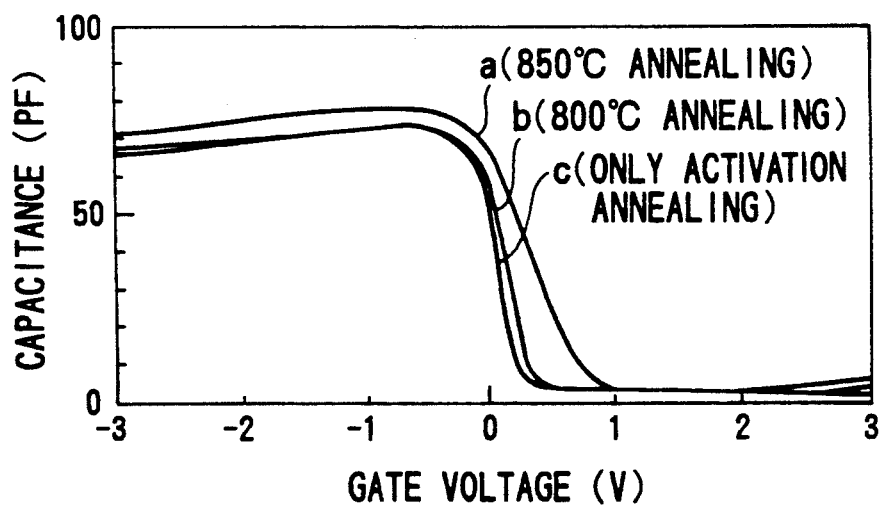
FIG. 14 is a graph showing capacitance vs. gate voltage characteristics of a conventional MOS diode having a gate electrode comprising a polysilicon layer doped with only boron.

FIG. 13 shows a relationship between the deposition rate and the acetylene flow rate of the carbon-doped polysilicon film. Even when the acetylene flow rate is increased, the deposition rate is kept unchanged. The conditions are the same as those in FIG. 12.

In this embodiment, disilane (Si$_2$H$_6$) is used as a silicon hydride. However, silane (SiH$_4$) as a more practical material or trisilane (Si$_3$H$_8$) which allows deposition at a lower temperature may be used. In this embodiment the carbon-, boron-doped polysilicon layer is formed using disilane, acetylene, and diborane gases. However, after a carbon-doped silicon layer is formed by a gas mixture of a silicon hydride and acetylene, a carbon-, boron-doped polysilicon layer may be formed by ion implantation or diffusion of boron from another material.

According to the apparatus of the second embodiment, as described above, diffusion of boron from the gate electrode to the silicon substrate can be suppressed. Variations in characteristics of the semiconductor device can be prevented even if annealing is performed upon formation of the gate electrode. According to the method of the second embodiment, a carbon-doped silicon film capable of suppressing diffusion of boron from the gate electrode to the substrate can be deposited at a practical rate, thereby providing a semiconductor device having a p-type gate electrode stable against annealing.

What is claimed is:

1. A semiconductor device of a MOS structure having a p-type gate electrode, wherein said gate electrode comprises a first layer of polysilicon doped with a constant concentration of carbon inert material and boron, wherein said first layer of polysilicon is formed on a MOS gate oxide film and a second layer of boron-doped polysilicon is formed over the entirety of said first layer of polysilicon doped with carbon inert material and boron.

2. The semiconductor device according to claim 1, wherein said constant concentration of said carbon inert material is within the range of 1 atm% to 5 atm%.

3. A semiconductor device of a MOS structure having a p-type gate electrode, wherein said gate electrode comprises a first layer of polysilicon doped with a constant concentration of nitrogen inert material and boron, wherein said first layer of polysilicon if formed on a MOS gate oxide film and a second layer of boron-doped polysilicon is formed over the entirely of said first layer of polysilicon doped with nitrogen inert material and boron.

4. The semiconductor device according to claim 3, wherein said constant concentration of said nitrogen inert material is within the range of 1 atm % to 5 atm %.

* * * * *

UNITED STATES PATENT AND TRADEMARK OFFICE
CERTIFICATE OF CORRECTION

PATENT NO. : 5,189,504
DATED : February 23, 1993
INVENTOR(S) : Nakayama et al.

It is certified that error appears in the above-identified patent and that said Letters Patent is hereby corrected as shown below:

In claim column 8 at line 61 replace "In this embodiment" with --In this embodiment,--;

In claim 3 in column 10 at line 11 replace "polysilicon if formed" with --polysilicon is formed--; at line 13 replace "over the entirely" with --over the entirety--.

Signed and Sealed this

Tenth Day of October, 1995

Attest:

BRUCE LEHMAN

Attesting Officer

Commissioner of Patents and Trademarks